(12) United States Patent
Kosier et al.

(10) Patent No.: US 7,466,004 B2
(45) Date of Patent: Dec. 16, 2008

(54) DIODE STRUCTURE TO SUPPRESS PARASITIC CURRENT

(75) Inventors: Steven L. Kosier, Lakeville, MN (US); David M. Elwood, Burnsville, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 415 days.

(21) Appl. No.: 11/455,343

(22) Filed: Jun. 19, 2006

(65) Prior Publication Data

US 2007/0290289 A1    Dec. 20, 2007

(51) Int. Cl.
H01L 29/872    (2006.01)
(52) U.S. Cl. ...................................................... 257/477
(58) Field of Classification Search .................. 257/477
See application file for complete search history.

Primary Examiner—Evan Pert
(74) Attorney, Agent, or Firm—Kinney & Lange, P.A.

(57) ABSTRACT

A diode conducts current between an anode terminal and a cathode terminal. The diode includes a parasitic transistor formed between one of the terminals and the substrate. The diode also includes a second transistor that competes with the parasitic transistor to direct current flow between the anode terminal and the cathode terminal.

19 Claims, 3 Drawing Sheets

DIODE STRUCTURE TO SUPPRESS PARASITIC CURRENT

BACKGROUND OF THE INVENTION

The present invention relates to an integrated circuit, and more particularly to a diode.

Integrated circuit devices contain many regions of doped semiconductor material. These doped regions may be either positively doped (p-type) so that they have an excess of holes, or they may be negatively doped (n-type) so that they have an excess of electrons. The boundary of positively doped and negatively doped regions creates a pn junction, which is the foundation for much of the semiconductor industry.

In non-ideal semiconductor devices, there are numerous regions of intersecting p-type and n-type material. As a result, unintended pn junctions. npn transistors and pnp transistors may be formed in addition to junctions intended to be created in the semiconductor device. These unintentional junctions and transistors, which are often oriented perpendicular to the substrate, can draw current away from its intended path. The current that is unintentionally drawn away from its intended path is referred to as "parasitic" current.

Parasitic current causes two main problems in semiconductor devices. First, parasitic current reduces the efficiency of the device by drawing current away from its intended path. Second, parasitic current may reach the doped substrate region of the device. Once in the substrate, the parasitic current is conducted to other parts of the device, where it may affect the current flow in other regions of the semiconductor device. Particularly, parasitic current can cause the problem of "latchup" in a semiconductor device. Latchup occurs when the parasitic current unintentionally drives a transistor into saturation mode. The saturation is sustained by positive feedback, which can prevent the circuit from operating and can also cause permanent damage and burn-out of the circuit.

One known method of reducing parasitic current is to electrically isolate semiconductor devices located on the same chip from one another. One known type of isolation is trench isolation. Using this technique, trenches are dug into the substrate around the various semiconductor devices on the chip. These trenches are typically dug using molecular beam epitaxy or ion bombardment. After the trench is dug, an oxide is grown inside of the trench. The oxide is an insulator and thus electrically isolates the device from other devices on the same chip. However, trench isolation is expensive and increases the number of steps that are needed to make a semiconductor device.

SUMMARY

In one embodiment, a diode conducts current between an anode terminal and a cathode terminal. The diode includes a parasitic transistor formed between one of the terminals and the substrate. The diode also includes a second transistor that competes with the parasitic transistor to direct current flow between the anode terminal and the cathode terminal.

DETAILED DESCRIPTION

Figure 1:
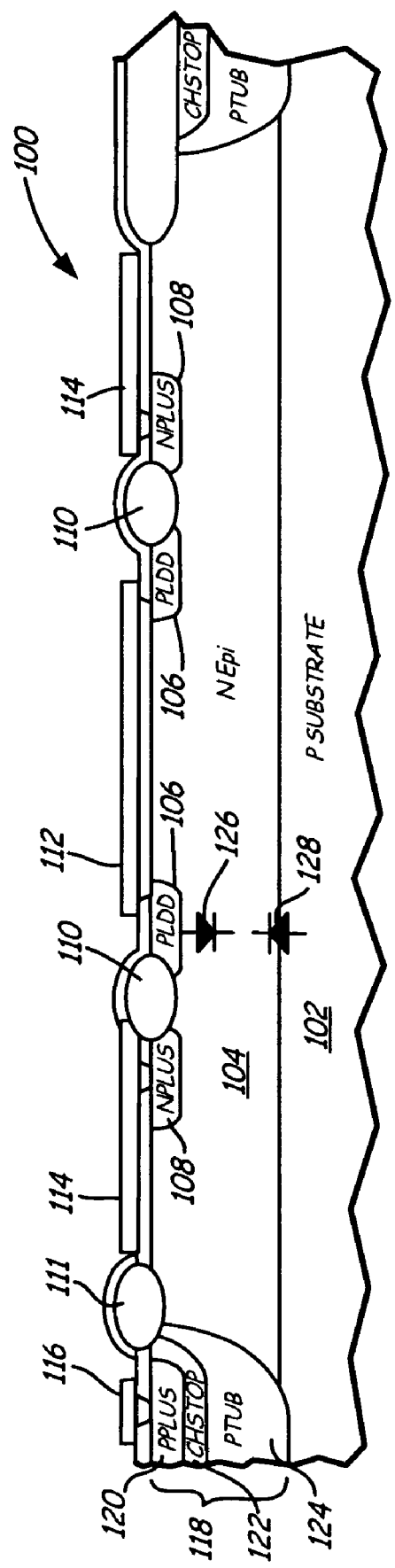
FIG. 1 is a cross-sectional view of a prior art Schottky diode operating in an ideal mode.

FIG. 1 is a cross-sectional view of prior art Schottky diode 100 operating in an ideal mode. Diode 100 includes p-type substrate 102, n-type epitaxial region 104, lightly doped p-type region 106, highly doped n-type region 108, glass region 110, glass region 111, anode terminal 112, cathode terminal 114, substrate terminal 116, and substrate connection 118 (including highly doped p-type region 120, channel stop region 122, and p-type tub region 124.

Ideally, it is desirable for all current to be conducted between anode terminal 112 and cathode terminal 114 of Schottky diode 100 when forward biased, such that no current flows through p-type substrate 102 or substrate terminal 116 (which is electrically connected to substrate 102 by substrate connection 118). This ideal operation is illustrated in FIG. 1 by diodes 126 and 128. In Schottky diode 100, current should flow freely from p-type region 106 to n-type epitaxial region 104, represented by diode 126. In addition, current should not be able to flow from n-epitaxial region 104 into p-type substrate 102, represented by diode 128, which is polarized opposite of diode 126. Thus, in the ideal operation of Schottky diode 100, diode 128 provides an effective barrier to stop all current flow into p-type substrate 102 and substrate terminal 116. As a result, all current flows between anode 112 and cathode 114 with no parasitic current flow.

It is important to understand that the above description is a desirable but fictional operation of Schottky diode 100, which does not occur in practice. Instead, Schottky diode 100 will actually operate in a non-ideal mode including undesirable parasitic current flow into substrate 102, as will now be described with reference to FIG. 2.

Figure 2:
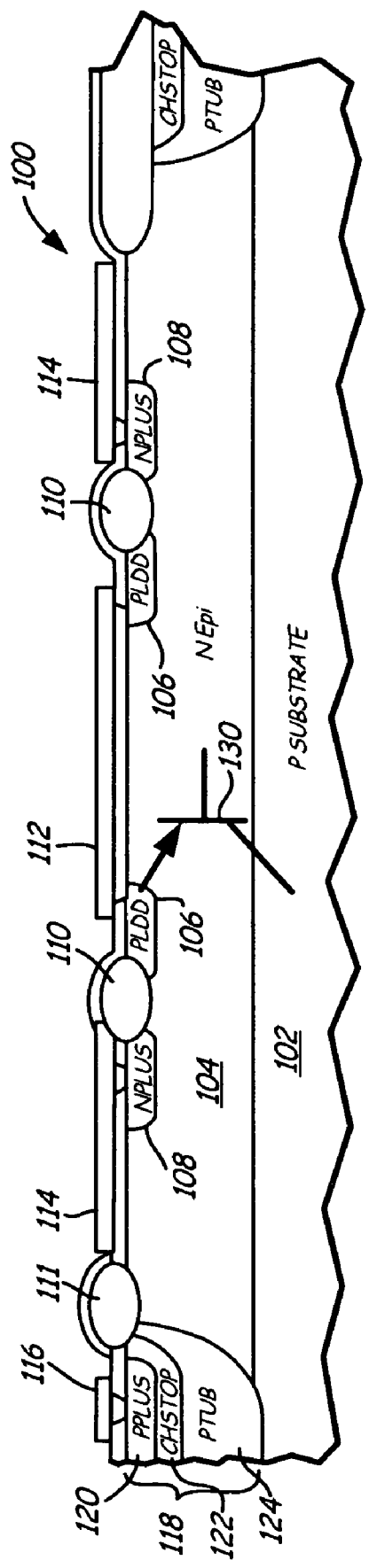
FIG. 2 is a cross-sectional view of a prior art non-ideal Schottky diode.

FIG. 2 is a cross-sectional view of prior art Schottky diode 100 illustrating the actual performance including parasitic current flow through p-type substrate 102 and substrate terminal 116. Although it is desirable that Schottky diode 100 act in the ideal manner discussed with reference to FIG. 1, in reality Schottky diode 100 does not operate in this manner. Instead, regions of Schottky diode 100 form parasitic transistor 130 that draws current away from cathode terminal 114 and into substrate 102 and substrate terminal 116. The parasitic transistor is formed by the pnp regions of lightly doped p-type region 106, n-type epitaxial region 104, and p-type substrate 102. The pn junction between lightly-doped p-type region 106 and n-type epitaxial region 104 forms the emitter-base junction of parasitic transistor 130 and the junction between p-type substrate 102 and n-type epitaxial region 104 forms the collector-base junction of parasitic transistor 130.

Parasitic transistor 130 operates to undesirably divert current away from the intended path (between anode terminal 112 and cathode terminal 114) and into substrate 102. Various problems can be caused by this current flow into substrate 102. One problem is that the efficiency of Schottky diode 100 is reduced, because less current is flowing in the desired current path. Another problem is that the parasitic current flow into substrate 102 can lead to latchup. Latchup is the result of minority carriers being injected into substrate 102 and connected substrate terminal 116. Substrate 102 is often shared with other semiconductor devices. As a result, an unintentional electrical connection can result between Schottky diode 100 and other devices built upon substrate 102. This current flow is generally unanticipated and can lead, for example, to saturation of a transistor of another device. The saturation mode can sometimes be sustained by positive feedback, which could prevent associated circuits from operating and could also cause permanent damage and burn-out of the associated circuits. Therefore, it is desirable to reduce or eliminate parasitic current flow into substrate 102.

Figure 3:
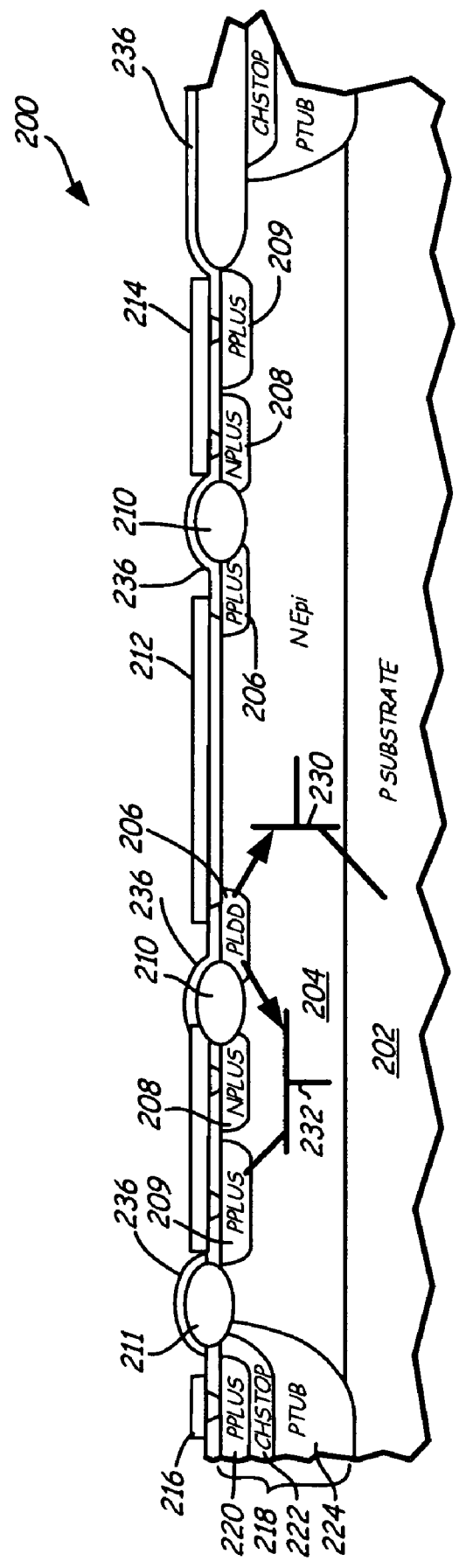
FIG. 3 is a cross-sectional view of one embodiment of a Schottky diode according to the present invention.

FIG. 3 is a cross-sectional view of Schottky diode 200 illustrating one embodiment of the present invention that reduces parasitic current flow into the substrate. Diode 200 includes p-type substrate 202, n-type epitaxial region 204, lightly doped p-type region 206, highly doped n-type region 208, highly doped p-type region 209, glass region 210, glass region 211, anode terminal 212, cathode terminal 214, substrate terminal 216, and substrate connection 218 (including highly doped p-type region 220, channel stop region 222, and p-type tub region 224). In this embodiment, diode 200 is formed having circular, oval, or other ring-shaped regions, resulting in generally symmetrical design around a vertical line of symmetry through anode terminal 212, n-type epitaxial region 204, and p-type substrate 202. It is recognized that other embodiments do not require ring-shaped regions.

Diode 200 is formed upon substrate 202, which is for example a portion of a semiconductor wafer including a p-type dopant. N-type epitaxial region 204 is formed on p-type substrate 202. Known masking and deposition or implantation steps are then used to deposit dopants of varying conductivity types (n-type or p-type) and of varying concentrations (to create highly doped or lightly doped regions) on desired portions of n-type epitaxial region 204. The dopants are then driven into n-type epitaxial region 204, such as by diffusion.

In one embodiment substrate connection 218 is formed by diffusing p-type dopants through n-type epitaxial region 204 until substrate connection 218 comes into contact with p-type substrate 202. Lightly doped p-type region 206 and highly doped p-type region 209 are formed by depositing or implanting p-type dopants on top of n-type epitaxial region 204 and then diffusing into n-type epitaxial region 204. Similarly, highly doped n-type region 208 is formed by depositing or implanting n-type dopants onto n-type epitaxial region 204 and then diffusing into n-type epitaxial region 204.

Glass region 210 is formed on n-type epitaxial region 204 to electrically insulate cathode terminal 214 and highly doped n-type region 208 from anode terminal 212 and lightly doped p-type region 206. In addition, glass region 211 is formed on n-type epitaxial region 204 to electrically insulate cathode terminal 214 and highly doped p-type region 214 from substrate terminal 216 and substrate connection 218.

Insulating layer 236 is formed over n-type epitaxial layer 204, doped regions 206,208,209, and 218, and glass regions 210 and 211. Portions of insulating layer 236 are then removed where terminal connections will be formed.

Terminals 212,214, and 216 are then formed. Anode terminal 212 is a metal layer formed on n-type epitaxial layer 204 and connected to lightly doped I-type region 206. Cathode terminal 214 is a metal layer formed on insulating layer 236 and connected to highly doped n-type region 208 and highly doped p-type region 209. Substrate terminal 216 is a metal layer formed on insulating layer 236 and connected to substrate connection 218.

Diode 200 includes pnp regions that form parasitic transistor 230, which tends to draw current into substrate 202, as described above with respect to FIG. 2. The parasitic transistor is a pnp transistor formed by lightly doped p-type region 206, n-type epitaxial region 204, and p-type substrate 202.

Diode 200 reduces or eliminates the problem of parasitic current experienced in prior art devices by inserting highly doped p-type region 209 between n-type epitaxial region 204 and cathode terminal 214. With the addition of highly doped p-type region 209, a lateral pnp transistor (transistor 232) is formed that competes with parasitic transistor 230. Transistor 232 is formed by highly doped p-type region 209, n-type epitaxial region 204, and lightly doped p-type region 206. Transistor 232 acts to divert current away from p-type substrate 202, and into highly doped p-type region 209. Therefore, more current flows in the desired current path between anode terminal 212 and cathode terminal 214.

Cathode terminal 214 is connected to both highly doped n-type region 208 and highly doped p-type region 209. In another embodiment, the arrangement of highly doped n-type region 208 and highly doped p-type region 209 can be reversed. In this embodiment, highly doped p-type region 209 is formed at the location of highly doped n-type region 208, and highly doped n-type region 208 is formed at the location of highly doped p-type region 209. In other words, the structure of diode 200 does not require that highly doped n-type region 208 be closer-to anode 212 (or lightly doped p-type region 206) than highly doped p-type region 209.

In another embodiment, multiple p-type regions and/or n-type regions (such as n-type region 208 and p-type region 209) can be fabricated in epitaxial region 204 and connected to cathode terminal 214. For example, n-type and p-type regions can be fabricated between glass region 210 and glass region 211 in an alternating configuration of n-type and p-type regions, such that each region is connected to cathode terminal 214. In another example, multiple n-type regions can be formed adjacent to each other and multiple p-type regions can be formed adjacent to each other, each region being connected to cathode terminal 214.

In another embodiment, the present invention reduces parasitic current flow into other areas of a device besides the substrate. Any undesired transistor formed within a device can cause an undesired parasitic current to flow within a device. The present invention can be used to divert current from the undesired path and to the desired path within the device.

Therefore, it can be seen that diode 200 improves over the prior art by reducing parasitic current flow into an undesired location and diverting the current to a desired location within a device. With the addition of p-type region 209, lateral transistor 232 is formed. Lateral transistor 232 competes with parasitic transistor 230 to reduce parasitic current flow.

Although the present invention has been described with reference to preferred embodiments, workers skilled in the art will recognize that changes may be made in form and detail without departing from the spirit and scope of the invention. For example, the present invention is described with reference to embodiments containing regions having specified conductivity types (p-type or n-type). It is recognized that conductivity types can be changed from p-type to n-type and from n-type to p-type with minimal modification to the overall device design, while still achieving the desired device performance.

The invention claimed is:

1. A diode comprising:
   a substrate of a first conductivity type;
   an epitaxial region of a second conductivity type adjacent the substrate;
   a first terminal;
   a second terminal spaced from the first terminal;
   a first region of the first conductivity type connected to the first terminal and the epitaxial region;
   a second region of the first conductivity type connected to the second terminal and the epitaxial region; and
   a third region of the second conductivity type connected to the second terminal and the epitaxial region.

2. The diode of claim 1, further comprising a third terminal electrically connected to the substrate.

3. The diode of claim 1, wherein the second region is located between the third region and the first region.

4. The diode of claim 1, wherein the third region is located between the second region and the first region.

5. The diode of claim 1, further comprising an electrically insulating region between the first region and the second region.

6. The diode of claim 1, wherein each of the first region, the second region, the third region, and the second terminal form a ring around the first terminal.

7. The diode of claim 1, wherein the second region comprises a plurality of regions of the first conductivity type.

8. The diode of claim 1, wherein the third region comprises a plurality of regions of the second conductivity type.

9. A diode for conducting current between a first terminal and a second terminal, the diode comprising:
   a substrate;
   an epitaxial region of a first conductivity type adjacent the substrate;
   a first doped region of a second conductivity type connected to the first terminal and the epitaxial region; and
   means for passing, current from the epitaxial region to the second terminal to divert current from an undesired location.

10. The diode of claim 9, wherein the means for passing current from the epitaxial region to the second terminal comprises a second doped region of the first conductivity type connected to the second terminal and the epitaxial region.

11. The diode of claim 9, the means for passing current from the epitaxial region to the second terminal comprises a third doped region of the second conductivity type connected to the second terminal and the epitaxial region.

12. The diode of claim 9, wherein the means for passing current from the epitaxial region to the second terminal comprises:
   a second doped region of the first conductivity type connected to the second terminal and the epitaxial region; and
   a third doped region of the second conductivity type connected to the second terminal and the epitaxial region.

13. The diode of claim 12, wherein the second terminal comprises a metal layer connected to the second doped region and the third doped region.

14. A diode comprising:
   a substrate of a first conductivity type;
   an epitaxial region of a second conductivity type adjacent the substrate;
   a first terminal adjacent the epitaxial region;
   a second terminal adjacent the epitaxial region and spaced from the first terminal;
   a first transistor comprising:
      a first region of the first conductivity type;
      the epitaxial region connected to the first region; and
      the substrate connected to the epitaxial region;
   a second transistor comprising:
      the first region;
      the epitaxial region connected to the first region; and
      a second region of the first conductivity type, connected to the epitaxial region and the second terminal and spaced from the first region; and
   a third region of the second conductivity type, connected to the epitaxial region and the second terminal.

15. The diode of claim 14, wherein the first transistor and the second transistor are pnp transistors.

16. The diode of claim 14, wherein a doping concentration of the third region is greater than a doping concentration of the epitaxial region.

17. The diode of claim 14, further comprising a third terminal electrically connected to the substrate.

18. The diode of claim 14, further comprising a buried layer between the substrate and the epitaxial region.

19. The diode of claim 14, further comprising an electrically insulating region between the first region and the third region.

* * * * *

UNITED STATES PATENT AND TRADEMARK OFFICE
CERTIFICATE OF CORRECTION

PATENT NO. : 7,466,004 B2  Page 1 of 1
APPLICATION NO. : 11/455343
DATED : December 16, 2008
INVENTOR(S) : Steven L. Kosier et al.

It is certified that error appears in the above-identified patent and that said Letters Patent is hereby corrected as shown below:

Column 2, Line 10, delete "124.", insert --124).--

Column 3, Line 43, delete "region 214 from", insert --region 209 from--

Column 3, Line 51, delete "I-type", insert --p-type--

Column 5, Line 22, delete "passing, current", insert --passing current--

Signed and Sealed this

Twenty-first Day of September, 2010

David J. Kappos
*Director of the United States Patent and Trademark Office*